United States Patent
Kaspar et al.

(10) Patent No.: US 10,727,126 B2
(45) Date of Patent: Jul. 28, 2020

(54) METHODS FOR FORMING A SEMICONDUCTOR DEVICE AND SEMICONDUCTOR DEVICES

(71) Applicant: Infineon Technologies AG, Neubiberg (DE)

(72) Inventors: Korbinian Kaspar, Regensburg (DE); Franco Mariani, Pentling-Neudorf (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 69 days.

(21) Appl. No.: 15/604,295

(22) Filed: May 24, 2017

(65) Prior Publication Data

US 2017/0345717 A1  Nov. 30, 2017

(30) Foreign Application Priority Data

May 25, 2016 (DE) .................. 10 2016 109 720

(51) Int. Cl.
*H01L 21/78* (2006.01)
*H01L 21/268* (2006.01)
*H01L 23/544* (2006.01)

(52) U.S. Cl.
CPC ............ *H01L 21/78* (2013.01); *H01L 21/268* (2013.01); *H01L 23/544* (2013.01); *H01L 2223/5448* (2013.01); *H01L 2223/54426* (2013.01); *H01L 2223/54433* (2013.01); *H01L 2223/54453* (2013.01)

(58) Field of Classification Search
CPC ............ H01L 21/78–786; H01L 21/77; H01L 21/304; H01L 21/70
See application file for complete search history.

(56) References Cited

U.S. PATENT DOCUMENTS

| | | | |
|---|---|---|---|
| 9,040,389 B2 | 5/2015 | Mackh et al. | |
| 2003/0044698 A1* | 3/2003 | Goedl | G03F 9/708 430/22 |
| 2007/0275541 A1* | 11/2007 | Harris | B23K 26/04 438/460 |

(Continued)

FOREIGN PATENT DOCUMENTS

| | | |
|---|---|---|
| CN | 103050480 A | 4/2013 |
| DE | 102013111016 A1 | 2/2014 |

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A method for forming a semiconductor device includes forming a laser marking buried within a semiconductor substrate and thinning the semiconductor substrate from a backside of the semiconductor substrate. For example, a semiconductor device includes a semiconductor substrate located in a semiconductor package. A laser marking is buried within the semiconductor substrate. For example, another semiconductor device includes a semiconductor substrate. A laser marking is located at a backside surface of the semiconductor substrate. Further, a portion of the backside surface located adjacent to the laser marking is free of recast material.

22 Claims, 5 Drawing Sheets

(56) References Cited

U.S. PATENT DOCUMENTS

| | | | | |
|---|---|---|---|---|
| 2009/0146325 A1* | 6/2009 | Liu | .................. | H01L 23/544 |
| | | | | 257/797 |
| 2012/0181640 A1* | 7/2012 | von Koblinski | ........ | H01L 21/84 |
| | | | | 257/421 |
| 2013/0126573 A1* | 5/2013 | Hosseini | ............ | B23K 26/0604 |
| | | | | 225/2 |
| 2014/0038392 A1* | 2/2014 | Yonehara | .............. | H01L 21/304 |
| | | | | 438/463 |
| 2016/0093534 A1 | 3/2016 | Kriebel et al. | | |

FOREIGN PATENT DOCUMENTS

| | | |
|---|---|---|
| DE | 102013207480 A1 | 10/2014 |
| WO | 2015011583 A1 | 1/2015 |

\* cited by examiner

METHODS FOR FORMING A SEMICONDUCTOR DEVICE AND SEMICONDUCTOR DEVICES

CROSS-REFERENCE TO RELATED APPLICATIONS

This application claims priority to German patent application No. 102016109720.9, filed on May 25, 2016, which application is hereby incorporated herein by reference in its entirety.

TECHNICAL FIELD

Embodiments relate to laser marking of semiconductor devices and in particular to methods for forming a semiconductor device and semiconductor devices.

BACKGROUND

For example, laser marking of chips may be used to label semiconductor dies for various reasons. For example, devices type, lot number and/or wafer number may be written on the semiconductor die by using a laser. It may be desired to increase the possible field of applications and/the flexibility of laser marking techniques.

SUMMARY

Some embodiments relate to a method for forming a semiconductor device. The method comprises forming at least one laser marking buried within a semiconductor substrate and thinning the semiconductor substrate from a backside of the semiconductor substrate.

Some embodiments relate to a semiconductor device comprising a semiconductor substrate located in a semiconductor package. A laser marking is buried within the semiconductor substrate.

Some other embodiments relate to a semiconductor device comprising a semiconductor substrate. A laser marking is located at a backside surface of the semiconductor substrate. Further, at least a portion of the backside surface located adjacent to the laser marking is free of recast material.

BRIEF DESCRIPTION OF THE DRAWINGS

Some embodiments of apparatuses and/or methods will be described in the following by way of example only, and with reference to the accompanying figures, in which.

DETAILED DESCRIPTION OF ILLUSTRATIVE EMBODIMENTS

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are 110 intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
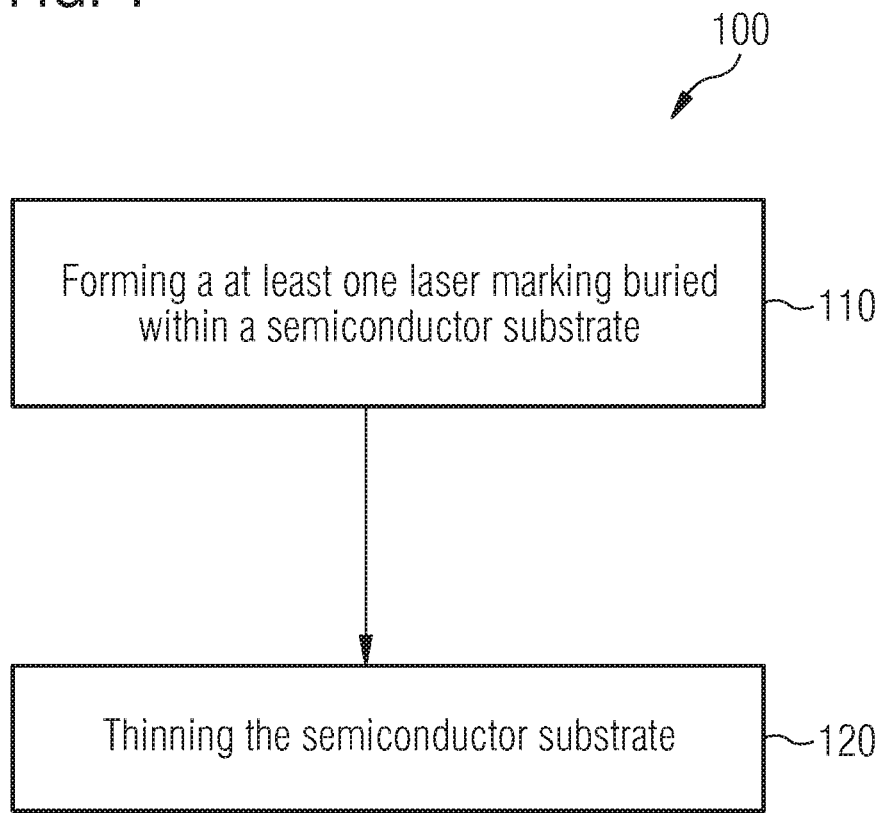
FIG. 1 shows a flow chart of a method for forming a semiconductor device.

FIG. 1 shows a flow chart of a method for forming a semiconductor device according to an embodiment. The method 100 comprises forming 110 at least one laser marking buried within a semiconductor substrate and thinning 120 the semiconductor substrate from a backside of the semiconductor substrate (e.g. after forming the laser marking).

A thinning after the laser marking may be enabled by forming the laser marking buried within the semiconductor substrate. In this way, the laser marking may be preserved, although a part of the semiconductor substrate is removed during thinning. Additionally, a high alignment accuracy for the laser marking may be enabled, although a dicing before grinding process may be used, since the laser marking may be formed before dicing and/or thinning. Further, the laser marking may be kept hidden in the semiconductor substrate, by forming the laser marking buried within the semiconductor substrate. In this way, the possible fields of application and/or the flexibility of the laser marking may be improved.

The laser marking may be formed 110 by a laser irradiating the semiconductor substrate from a front side or a backside of the semiconductor substrate. The laser may be focused in to a desired depth within the semiconductor substrate to generate the laser marking below the surface of the semiconductor substrate. For example, the laser amorphizes and/or vaporizes portions of the semiconductor material of the semiconductor substrate in proximity of the focus of the laser to form 110 the laser marking. For example, the laser used for forming the laser marking may be an infrared laser (e.g. emitting light with a characteristic wave length between $1*10^{-3}$ m and $7.8*10^{-7}$ m). The laser marking may be formed 110 by an infrared IR laser focused at a predefined depth below a surface of the semiconductor substrate.

The laser marking may be formed 110 by a laser from a back side (e.g. backside stealth marking with an IR laser) of the semiconductor substrate, so that a masking of the laser due to wiring structures at the front side may be avoided. Alternatively, the laser marking may be formable from the front side, if a metal occupancy due to wiring structures within a layer stack located at the front side allows an irradiation of a portion of the semiconductor substrate envisaged for the laser marking.

The laser marking may be formed 110 at a distance of more than 5 µm (or more than 10 µm, more than 20 µm or more than 50 µm) from each surface of the semiconductor substrate (measured before thinning of the semiconductor substrate). For example, the laser marking may be formed close to or at a depth from the front side surface equal to a target thickness of the semiconductor substrate after thinning 120. For example, the laser marking may be formed at a distance from the front side surface of more than 20 µm (or more than 50 µm, more than 100 µm or more than 200 µm) and less than 800 µm (or less than 600 µm, less than 300 µm or less than 100 µm). The laser marking may be formed in a bulk semiconductor portion of the semiconductor substrate (e.g. outside doping regions of electrical elements formed at the front side, for example, source/drain doping regions of transistors or well doping regions).

The laser marking may comprise a vertical extension of more than 2 µm (or more than 5 µm, or more than 10 µm) and/or less than 20 µm (or less than 15 µm or less than 10 µm). The vertical extension may be a maximal vertical dimension measured orthogonal to the front side surface from a part of the laser marking closest to the front side surface to a part of the laser marking closest to the backside surface before thinning 120. The laser marking may comprise a lateral length of more than 1 µm (or more than 5 µm, more than 10 µm or more than 20 µm) and less than 200 µm (or less than 100 µm or less than 50 µm) and/or a lateral width of more than 500 nm (or more than 1 µm or more than 5 µm) and less than 50 µm (or less than 20 µm or less than 10 µm). The laser marking may comprise one or more characters (e.g. type of device, lot number, wafer number and/or device number), symbols (e.g. logo) and/or geometric shapes (e.g. point, circle, square, or cross). The laser marking may be formed 110 during focusing the laser to a single depth or may be formed in two or more runs while varying the depth of focus of the laser. For example, the laser may be focused to a first depth for forming a first vertical portion of the laser marking and then the laser may be focused to a second depth to form a second vertical portion of the laser marking.

The semiconductor substrate may be thinned 120 (e.g. by grinding, chemical mechanical polishing and/or plasma etching) to a desired target thickness for the one or more semiconductor devices to be formed. The desired thickness of the semiconductor substrate may correlate to vertical position of the laser marking. For example, the thinning 120 of the semiconductor substrate may be performed after forming 110 the laser marking. For example, thinning 120 the semiconductor substrate may be stopped at the laser marking so that the laser marking is exposed at the backside surface of the semiconductor substrate. For example, a portion of the laser marking located closer to the backside surface is removed during thinning 120 while another portion located closer to the front side remains after thinning 120. In this way, the laser marking may be visible (e.g. without using infrared imaging) at the back side surface. For example, the laser marking may be used to identify the semiconductor device and/or for determining an orientation during assembly and/or packaging (e.g. the laser marking may indicate a side of a source or drain pad of a power semiconductor device). For example, the method 100 may comprise placing a semiconductor device comprising at least a portion of the semiconductor substrate comprising the at least one laser marking for assembly or packaging depending on a lateral position of the laser marking at the semiconductor substrate of the semiconductor device.

Alternatively, thinning 120 the semiconductor substrate may be stopped before reaching the laser marking. In this case, the laser marking stays hidden within the semiconductor substrate. The laser marking may be visualized by using infrared imaging. For example, the laser marking is still buried within the semiconductor substrate in the final product. In this example, the thinning 120 of the semiconductor substrate may be performed before or after forming the laser marking. For example, the method 100 may comprise assembling and/or packaging a semiconductor device comprising at least a portion of the semiconductor substrate comprising the at least one laser marking after thinning 120 the semiconductor substrate while the laser marking stays buried within the semiconductor substrate.

Optionally, the method 100 may additionally comprise a pre-thinning (e.g. to a thickness larger than the target thickness) and/or polishing (e.g. mirror polishing) before forming 110 the laser marking to provide a sufficiently even and/or clean surface for forming 110 the laser marking.

The method 100 may additionally comprise identifying an alignment structure based on an infrared image (e.g. generated by an infrared camera or by using a different operating mode of the laser used for forming the laser marking, for example, backside alignment with IR camera) of at least a part of the semiconductor substrate. Further, an alignment (e.g. moving the laser a position relative to the alignment structure) for forming the laser marking may be performed based on the identified alignment structure. For example, the alignment structure may be a doping region within the semiconductor substrate, a kerf between portions of the semiconductor substrate and/or a metal structure within the layer stack at the front side of the semiconductor device. In this way, a very accurate alignment may be achievable at the back side.

For example, more than one laser marking may be formed buried within the semiconductor substrate. Forming 110 the at least one laser marking may comprise forming a plurality of laser markings buried within semiconductor substrates and laterally located at different portions of the semiconductor substrate used for forming a plurality of semiconductor devices. For example, a laser marking may be formed on every (or every second, every third, or every n-th) portion of the semiconductor substrate used for implementing a respective semiconductor device of a plurality of semiconductor devices. The portion of the semiconductor substrate used for implementing a respective semiconductor device may be the semiconductor die remaining after dicing. The laser marking may be formed at a portion of the semiconductor substrate remaining after separating the plurality of semiconductor devices from each other. For example, the laser marking may be formed more than 1 μm (or more than 5 μm or more than 10 μm) away from a closest kerf or dicing street. For example, the laser marking still exists at the semiconductor die of the semiconductor device after separating (e.g. dicing) the semiconductor devices from each other. It may be possible to identify the laser marking at the final semiconductor device.

For example, integrated circuits and/or electrical element arrangements (e.g. diodes or transistors) of a plurality of semiconductor devices are formed (e.g. by implantation of doping regions and/or deposition and structuring of insulting layers and conductive layers) at (the front side surface of) the semiconductor substrate being a semiconductor wafer. After forming the integrated circuits and/or electrical element arrangements of the semiconductor devices, the semiconductor wafer may be diced (e.g. sawing or laser dicing). For example, the method 100 may further comprise dicing the semiconductor substrate to enable a separation of the plurality of semiconductor devices. The plurality of semiconductor devices may be already separated from each other due to the dicing or the dicing may be performed to a depth deeper than the target thickness of the semiconductor substrate (but not completely to the back side) so that the semiconductor devices may be separated from each other during thinning 120 the semiconductor substrate. The dicing of the semiconductor may be performed before thinning 120 the semiconductor substrate (e.g. dicing before grinding) or after thinning 120 the semiconductor substrate. The portions of the semiconductor substrate belonging to the plurality of semiconductor devices may be thinned simultaneously, independent from whether the semiconductor substrate is diced before or after thinning 120 the semiconductor substrate.

The semiconductor substrate of the semiconductor device may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, a silicon germanium (SiGe) based semiconductor substrate, or gallium arsenide (GaAs)-based semiconductor substrate, or a gallium nitride (GaN)-based semiconductor substrate. The semiconductor substrate may be a semiconductor wafer or a semiconductor die.

For example, a plurality of semiconductor devices may be formed on a semiconductor wafer and may be separated from each other after thinning 120 the semiconductor wafer.

For example, the vertical direction and a vertical dimension or thicknesses of layers may be measured orthogonal to a front side surface of the semiconductor substrate and a lateral direction and lateral dimensions may be measured in parallel to the front side surface of the semiconductor substrate.

For example, the semiconductor device may be an integrated circuit, a processor device, a sensor device or a power semiconductor device. A power semiconductor device or an electrical structure (e.g. transistor structure or diode structure) of the power semiconductor device may have a breakdown voltage or blocking voltage of more than 10 V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

Figure 2:
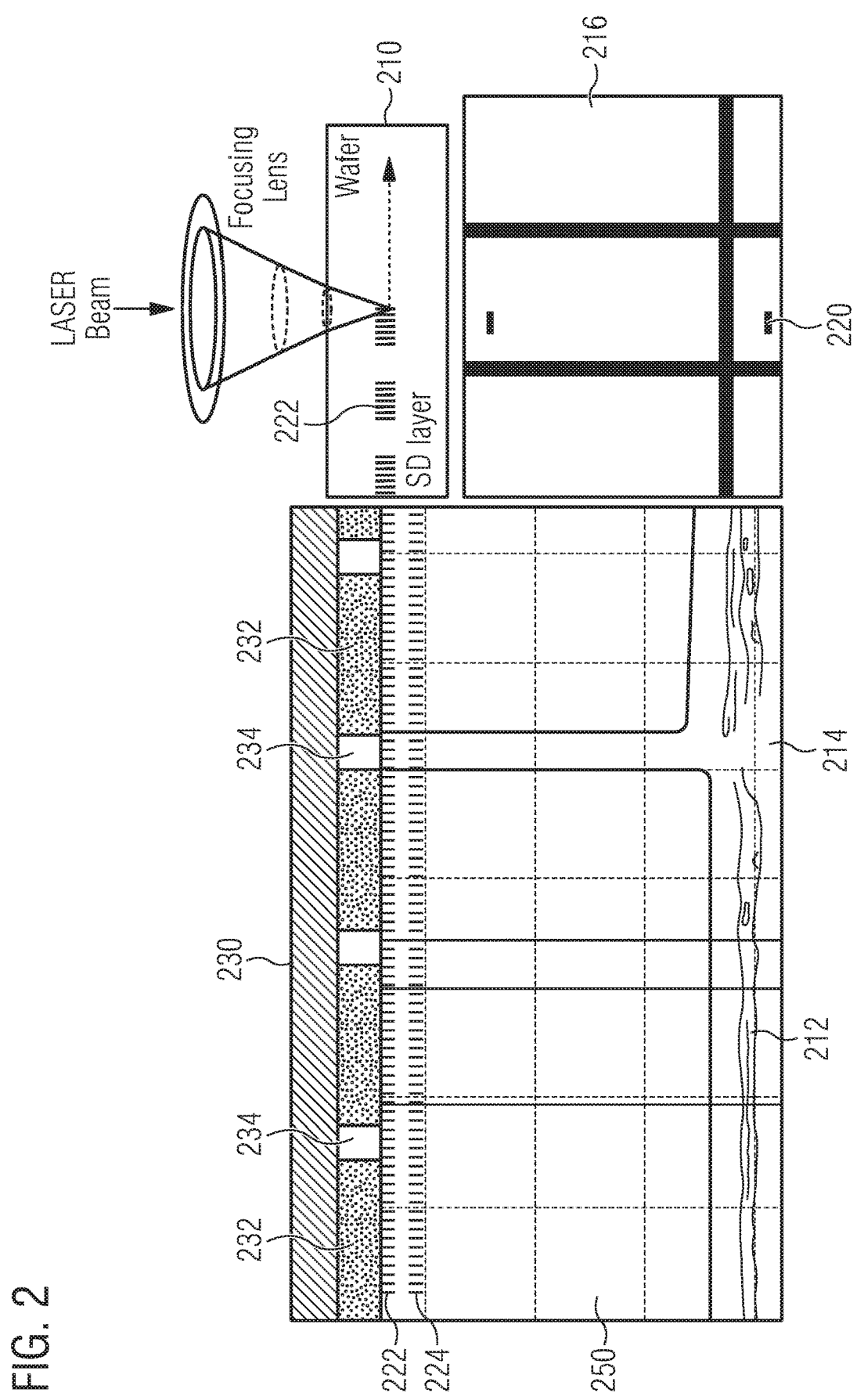
FIG. 2 shows a schematic cross section of a semiconductor substrate during grinding as well as a schematic illustration of forming a laser marking and a schematic top view after grinding.

FIG. 2 shows a schematic cross section (side view image) of a semiconductor substrate during thinning down to a respective thickness as well as a schematic illustration of forming a laser marking and a schematic top view after grinding.

The upper right part of FIG. 2 (side view sketch) schematically illustrates a laser beam focused (e.g. by one or more focusing lenses) to a desired depth (e.g. stealth dicing SD layer) within a semiconductor wafer 210 to form a first vertical portion 222 of a laser marking 220. Afterwards, a second vertical portion 224 of the laser marking 220 is formed at a slightly different depth as indicated in the left part of FIG. 2.

The left part of FIG. 2 shows a schematic cross section of the semiconductor wafer during grinding. The semiconductor substrate was already diced before grinding so that a dicing trench 214 exits between neighboring semiconductor devices 250. Each semiconductor device 250 comprises a portion of the semiconductor wafer with a layer stack at the front side of the semiconductor wafer and a laser marking 220 exposed at the back side of the back side surface. A grinding wheel 230 is used to thin the semiconductor substrate from the backside. The grinding wheel 230 comprises a plurality of grinding segments 232 (e.g. comprising diamonds in a matrix) and trenches 234 between the grinding segments to convey grinded material away. The grinding may be stopped after reaching the first vertical portion 222 or the second vertical portion 224 of the laser marking 220.

The lower right part of FIG. 2 shows a schematic back side top view of a part of the semiconductor wafer after thinning (grinding). Several portions 216 of the semiconductor wafer belonging to several semiconductor devices are shown and some of the portions comprise laser markings 220 exposed at the backside surface.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIGS. 3-6b).

Figure 3:
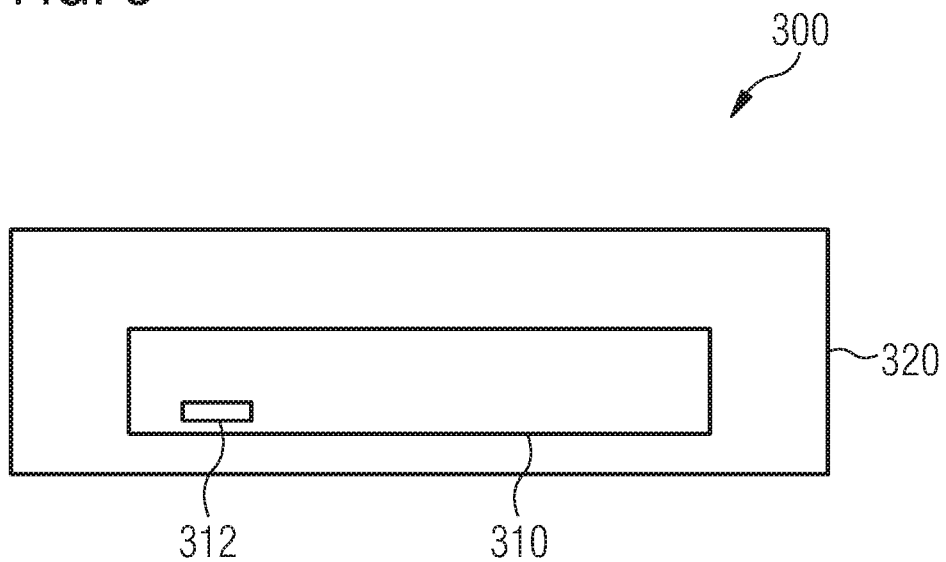
FIG. 3 shows a schematic cross section of a semiconductor device with a buried laser marking.

FIG. 3 shows a schematic cross section of a semiconductor device according to an embodiment. The semiconductor device 300 comprises a semiconductor substrate 310 located in a semiconductor package 320. A laser marking 312 is buried within the semiconductor substrate 310.

For example, the laser marking may be hidden within the semiconductor substrate, since the laser marking is buried within the semiconductor substrate in the packaged device. The laser marking may be visualized by infrared imaging techniques, for example.

Various types of semiconductor packages may be used depending on the type and/or application of the semiconductor device. For example, the semiconductor package may be a through-hole package, a surface mount package, a chip carrier package, a pin grid array package, a flat package, a small outline package, a chip-scale package, a ball grid array package, a transistor, diode, a small pin count integrated circuit IC package, a multi-chip packages or another package.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIGS. 1-2) or below (e.g. FIGS. 4-6b).

Figure 4:
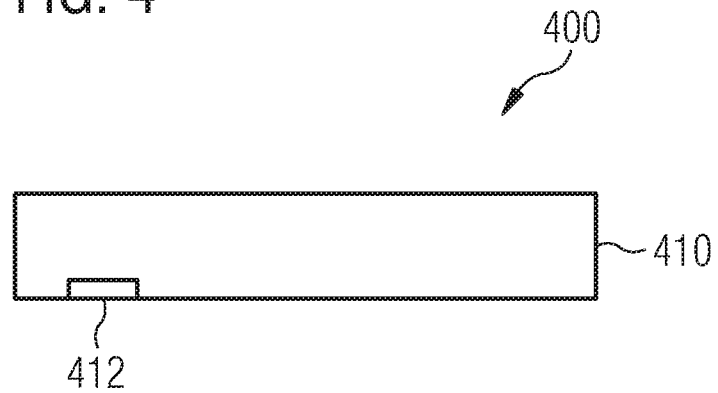
FIG. 4 shows a schematic cross section of another semiconductor device with a laser marking at a back side of a semiconductor substrate.

FIG. 4 shows a schematic cross section of a semiconductor device according to an embodiment. The semiconductor device 400 comprises a semiconductor substrate 410. A laser marking 412 is located at a backside surface of the semiconductor substrate 410. Further, at least a portion of the backside surface located adjacent to the laser marking 412 is free of recast material.

By forming a laser marking buried within a semiconductor substrate before thinning the semiconductor substrate to a target thickness, a recast of material on the backside surface of the final semiconductor device due to forming the laser marking can be avoided in comparison to forming the laser marking directly at the backside surface after thinning. Consequently, a semiconductor device without recast material at the backside surface in proximity to the laser marking may be formed based on the proposed concept. Otherwise recast material would be located adjacent to the laser marking, for example.

The recast material may be the same material as the material of the semiconductor substrate 410, but may be amorphous instead of monocrystalline, for example.

The backside surface of the semiconductor substrate 410 may be free of recast material at least at an area extending laterally from the laser marking to a distance of more than 10 µm (or more than 50 µm).

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIGS. 1-3) or below (e.g. FIGS. 5a-6b).

Figure 5A:
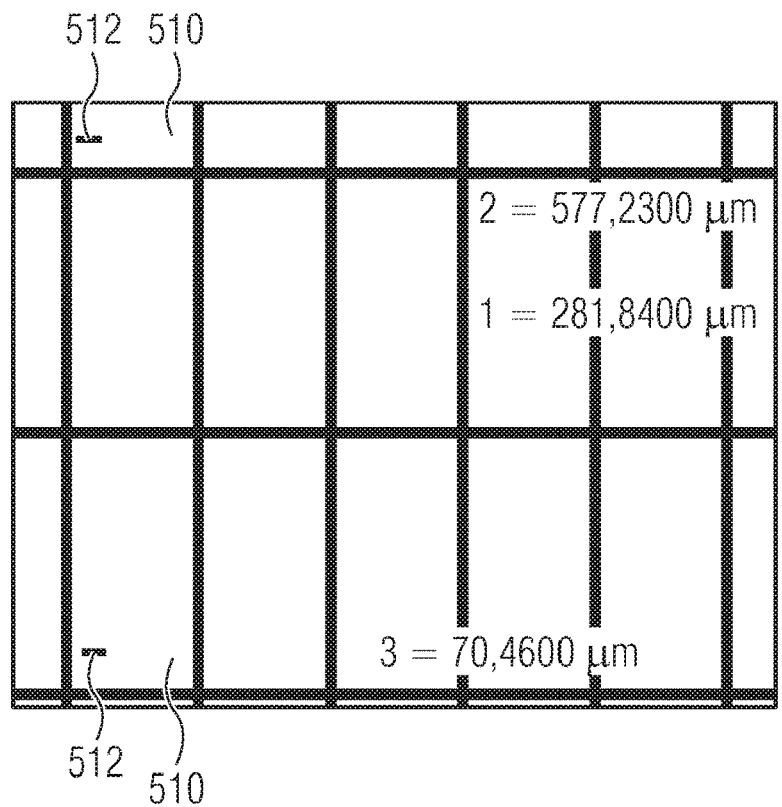
FIG. 5*a* shows a schematic top view of a semiconductor substrate after thinning.

FIG. 5a shows a schematic back side top view of a semiconductor substrate after thinning according to an embodiment. The semiconductor substrate is formed similar to the method described in connection with FIG. 1. In this example, the devices 510 of every second column (every second chip in a row is marked) of semiconductor devices 510 (e.g. comprising a lateral size of around 281 µm×577 µm) comprise a laser marking 512 (e.g. comprising a length of around 70 µm).

Figure 5B:
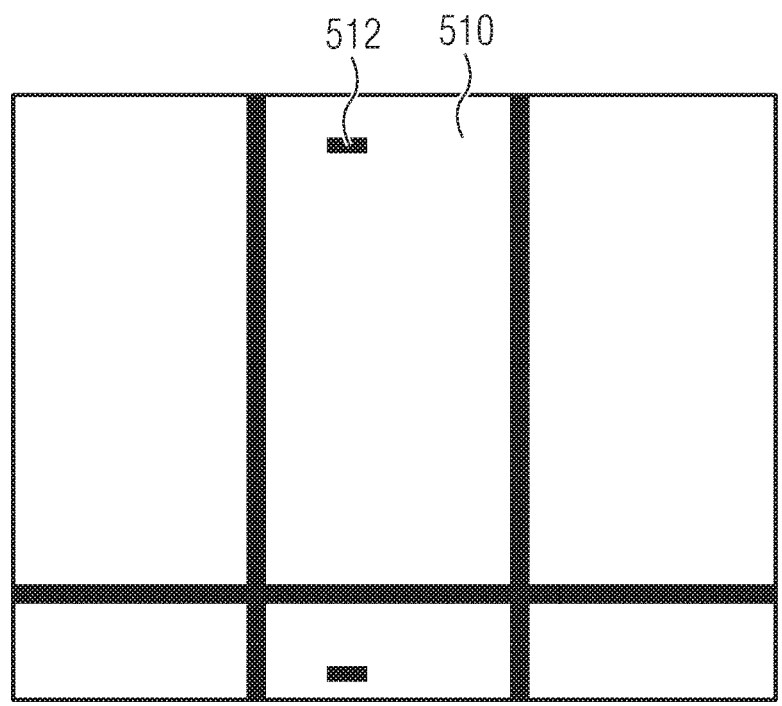
FIG. 5*b* shows a schematic top view of another semiconductor substrate after thinning.

FIG. 5b shows a schematic back side top view of another semiconductor substrate after thinning according to an embodiment. The semiconductor substrate is formed similar to the semiconductor substrate shown in FIG. 5a.

Figure 6A:
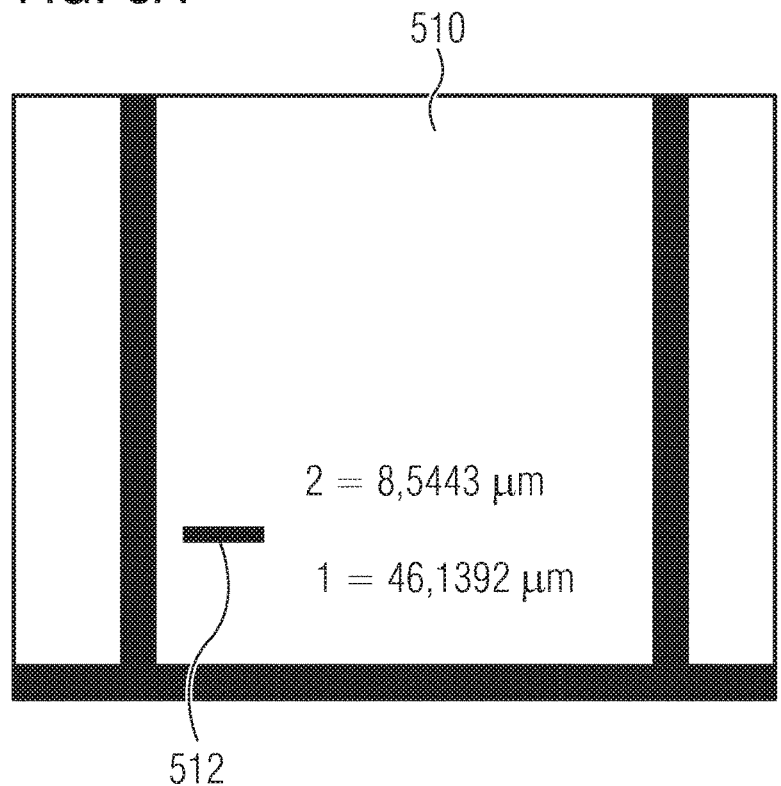
FIG. 6*a* shows a schematic top view of another semiconductor substrate after thinning.

FIG. 6a shows a schematic back side top view of another semiconductor substrate after thinning according to an embodiment. The semiconductor substrate is formed similar to the semiconductor substrate shown in FIG. 5a. However, the laser marking comprises a lateral size of around 8.5 µm×46 µm.

Figure 6B:
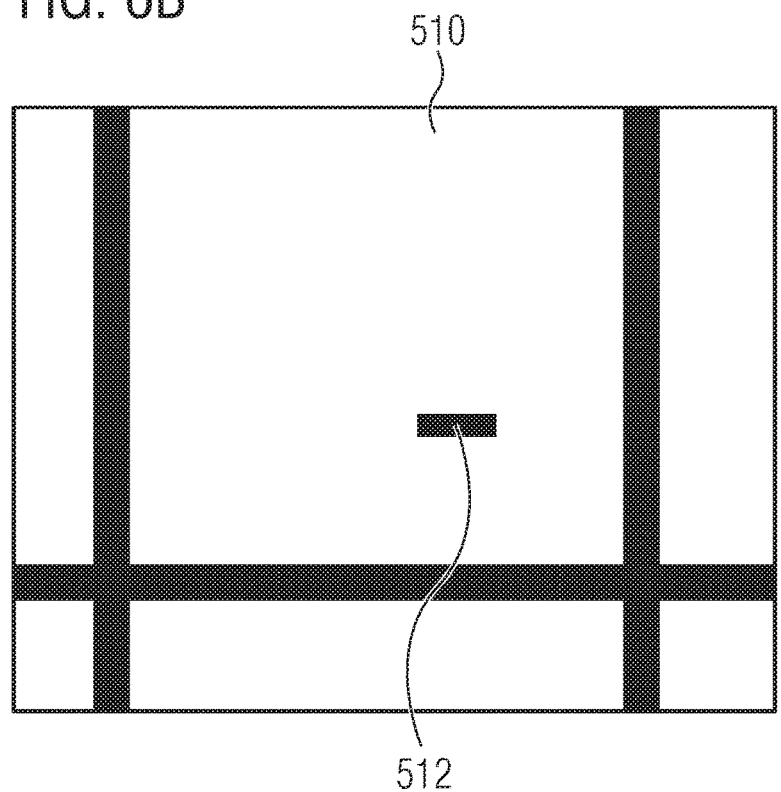
FIG. 6*b* shows a schematic top view of another semiconductor substrate after thinning.

FIG. 6b shows a schematic back side top view of another semiconductor substrate after thinning according to an embodiment. The semiconductor substrate is formed similar to the semiconductor substrate shown in FIG. 6a.

Some embodiments relate to an (in)visible laser marking. Chips may be laser labeled at the backside after thinning. A good position accuracy may be obtained by alignment to the front side, if the wafer is not already diced. The position accuracy might not be ensured at an already diced wafer, since the position accuracy for each individual chip may only be determinable with very high effort (time and software). The proposed concept may provide a possibility to perform a laser marking for a dice before grind DBG process.

The wafer may be marked by a stealth laser from a backside at a desired depth in a thick state. The front side structure may serve as alignment mark, which may be used as a reference point from the back side by an infrared IR camera. Afterwards, the wafer may be thinned to its proper depth. The lasered region and consequently the marked region may be exposed during the thinning process. This region may represent the laser marking.

For example, a laser marking on an entire hole wafer may be possible. Any free form shape (e.g. letters, circle, bars or others) may be implemented by the stealth laser technology, for example. A high accuracy with a higher feed speed as a single chip alignment and marking may be achievable. Further, 110 vaporized material may be produced.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
   forming a laser marking buried within a semiconductor substrate having a first thickness; and
   thinning the semiconductor substrate from a backside of the semiconductor substrate to a second thickness less than the first thickness,
   wherein the laser marking is laterally intact in a direction parallel to a surface of a final version of the semiconductor device, and wherein thinning the semiconductor substrate is stopped before reaching the laser marking.

2. The method according to claim 1, wherein the laser marking is formed by an infrared laser focused at a predefined depth below each surface of the semiconductor substrate.

3. The method according to claim 1, wherein the laser marking is formed by a laser from the backside of the semiconductor substrate.

4. The method according to claim 1, wherein the laser marking is formed in a bulk semiconductor portion of the semiconductor substrate.

5. The method according to claim 1, wherein the laser marking is formed at a distance of more than 5 µm from each surface of the semiconductor substrate.

6. The method according to claim 1, wherein the laser marking comprises a vertical extension of more than 2 µm.

7. The method according to claim 1, wherein the laser marking comprises a vertical extension of less than 20 µm.

8. The method according to claim 1, further comprising packaging a semiconductor device comprising a portion of the semiconductor substrate comprising the laser marking after thinning the semiconductor substrate while the laser marking stays buried within the semiconductor substrate.

9. The method according to claim 1, wherein forming the laser marking comprises forming a plurality of laser markings buried within the semiconductor substrate, the plurality of laser markings being laterally located at different portions of the semiconductor substrate used for forming a plurality of semiconductor devices.

10. The method according to claim 9, wherein the plurality of laser markings are formed in alternate ones of the plurality of semiconductor devices.

11. The method according to claim 9, further comprising dicing the semiconductor substrate to enable a separation of the plurality of semiconductor devices.

12. The method according to claim 11, wherein the semiconductor substrate is diced before thinning the semiconductor substrate.

13. The method according to claim 1, wherein forming the laser marking comprises focusing a laser to a first depth for forming a first vertical portion of the laser marking and focusing the laser to a second depth to form a second vertical portion of the laser marking.

14. The method according to claim 1, further comprising identifying an alignment structure based on an infrared image of a part of the semiconductor substrate, wherein an alignment for forming the laser marking is performed based on the identified alignment structure.

15. The method according to claim 1, wherein the laser marking comprises a character, a symbol, or a geometric shape.

16. The method according to claim 1, further comprising placing a semiconductor device comprising a portion of the semiconductor substrate comprising the laser marking for assembly or packaging depending on a lateral position of the laser marking at the portion of the semiconductor substrate of the semiconductor device.

17. The method according to claim 1, wherein thinning the semiconductor substrate comprises grinding, chemical mechanical polishing and/or plasma etching the semiconductor substrate.

18. The method according to claim 1, wherein forming the laser marking comprises forming the laser marking more than 1 µm away from a closest kerf or dicing street of the semiconductor substrate.

19. A method for forming a semiconductor device, the method comprising:
   forming a laser marking buried within a semiconductor substrate having a first thickness; and
   thinning the semiconductor substrate from a backside of the semiconductor substrate to a second thickness less than the first thickness,
   wherein thinning the semiconductor substrate is stopped before reaching the laser marking.

20. A method for forming a semiconductor device, the method comprising:
   forming a laser marking buried within a semiconductor substrate having a first thickness; and
   thinning the semiconductor substrate from a backside of the semiconductor substrate to a second thickness less than the first thickness,
   wherein the laser marking is laterally intact in a direction parallel to a surface of a final version of the semiconductor device, and wherein the laser marking is formed at a distance of more than 5 µm from each surface of the semiconductor substrate.

21. A method for forming a semiconductor device, the method comprising:
   forming a laser marking buried within a semiconductor substrate having a first thickness; and
   thinning the semiconductor substrate from a backside of the semiconductor substrate to a second thickness less than the first thickness, wherein the laser marking is laterally intact in a direction parallel to a surface of a final version of the semiconductor device, and wherein the laser marking comprises a vertical extension of more than 2 µm.

22. A method for forming a semiconductor device, the method comprising:

forming a laser marking buried within a semiconductor substrate having a first thickness; and thinning the semiconductor substrate from a backside of the semiconductor substrate to a second thickness less than the first thickness, wherein the laser marking is laterally intact in a direction parallel to a surface of a final version of the semiconductor device, and wherein the laser marking comprises a vertical extension of less than 20 µm.

* * * * *